US007783457B2

(12) United States Patent
Cunningham

(10) Patent No.: US 7,783,457 B2
(45) Date of Patent: Aug. 24, 2010

(54) SENSOR LOCALIZATION USING LATERAL INHIBITION

(75) Inventor: Helen A. Cunningham, Los Altos Hills, CA (US)

(73) Assignee: Oracle America, Inc., Redwood Shores, CA (US)

( * ) Notice: Subject to any disclaimer, the term of this patent is extended or adjusted under 35 U.S.C. 154(b) by 362 days.

(21) Appl. No.: 11/454,385

(22) Filed: Jun. 15, 2006

(65) Prior Publication Data

US 2008/0126272 A1 May 29, 2008

(51) Int. Cl.

| | |
|---|---|
| ***H03F 1/26*** | (2006.01) |
| ***H04B 1/00*** | (2006.01) |
| ***H04B 1/04*** | (2006.01) |
| ***H04B 7/00*** | (2006.01) |
| ***H04B 1/10*** | (2006.01) |
| ***G08B 1/08*** | (2006.01) |
| *G06F 15/18* | (2006.01) |
| *G05B 15/00* | (2006.01) |

(52) U.S. Cl. .................. 702/189; 455/63.1; 455/114.2; 455/278.1; 455/296; 340/539.26; 340/340.21; 700/75; 706/12

(58) Field of Classification Search ................. 702/189; 706/12; 455/63.1, 114.2, 278.1, 296; 700/75; 340/539.26, 539.21

See application file for complete search history.

(56) References Cited

U.S. PATENT DOCUMENTS

| | | | | |
|---|---|---|---|---|
| 6,400,318 | B1 * | 6/2002 | Kasami et al. | 342/383 |
| 6,832,074 | B2 * | 12/2004 | Borras-Chia et al. | 455/67.13 |
| 7,039,361 | B1 * | 5/2006 | Collins | 455/63.1 |
| 7,454,174 | B2 * | 11/2008 | Stein et al. | 455/69 |
| 2001/0016490 | A1 * | 8/2001 | Martin-Leon et al. | 455/424 |
| 2004/0073361 | A1 * | 4/2004 | Tzamaloukas et al. | 701/210 |
| 2005/0048987 | A1 * | 3/2005 | Glass | 455/456.1 |
| 2006/0087425 | A1 * | 4/2006 | Haeberlen et al. | 340/539.13 |

FOREIGN PATENT DOCUMENTS

JP 2001168796 * 12/1999

* cited by examiner

*Primary Examiner*—Albert DeCady
*Assistant Examiner*—Thomas H Stevens
(74) *Attorney, Agent, or Firm*—Park, Vaughan & Fleming LLP

(57) ABSTRACT

A system including multiple devices that each have a sensor and are each configured to communicate with other devices. The system further includes a controller configured to provide command information that specifies a mode of operation of the devices. In a first mode of operation, the devices transmit communication signals and a given device modifies a strength of its communication signal from an initial strength to a final strength based on communication signals it receives from one or more other devices. And in a second mode of operation, the devices transmit communication signals and the given device dynamically adjusts a strength of its communication signal based communication signals it receives from one or more other devices and on measurements performed by the sensor in the given device.

19 Claims, 12 Drawing Sheets

SENSOR LOCALIZATION USING LATERAL INHIBITION

BACKGROUND

1. Field of the Invention

The present invention relates to techniques for determining sensor positions and improving the spatial resolution of measurements performed with these sensors. More specifically, the present invention relates to arrays of sensors that utilize lateral inhibition when communicating with one another.

2. Related Art

Many measurement and monitoring systems include distributed arrays of interacting sensors, which are also known as sensor networks. For example, sensor networks are used to perform measurements of parameters such as temperature and humidity or to monitor intrusion across virtual borders in a variety of environments. In order to provide useful information in these applications, the locations of the sensors often need to be known or inferred. However, the use of pre-determined sensor locations is not possible in an increasingly popular category of sensor networks that allow random or ad hoc sensor placement. In these networks, the sensor positions need to be determined after the sensors are distributed in a region.

While there are many existing localization techniques that may be used in sensor networks, these approaches are often unattractive due to additional system constraints, such as power requirements, limitations on onboard resources (for example, the processor speed or the amount of memory), cost, as well as maintenance and reliability restrictions. For example, in one existing approach sensor positions may be determined using acoustic and radio signals. However, this technique uses multiple base stations as well as high-frequency transmitters and receivers that are expensive and consume significant power. Another existing approach localizes sensors using variations in the strength of radio signals as a function of distance. Unfortunately, effects such as noise, interference, multi-path signals, and the difficulty of determining strength changes at very close range have limited the efficacy of this technique.

Furthermore, allowing random sensor positions may have consequences for the spatial resolution of measurements performed by sensors in an ad hoc sensor network. In particular, the spatial resolution of an array of optical sensors may depend on the sensor density for a given intensity of incident light. When the sensor placement, and thus the sensor density, is random, it may therefore be difficult to achieve a desired or optimal spatial resolution from the array.

Hence, what is needed is a method and an apparatus that facilitates determining sensor positions in a sensor network and that facilitates adjusting of the spatial resolution of measurements performed using the sensor network without the problems listed above.

SUMMARY

One embodiment of the present invention provides a system including multiple devices that each have a sensor and are each configured to communicate with other devices. The system further includes a controller configured to provide command information that specifies a mode of operation of the devices. In a first mode of operation, the devices transmit communication signals and a given device modifies the strength of its communication signal from an initial strength to a final strength based on communication signals it receives from one or more other devices. In a second mode of operation, the devices transmit communication signals, and the given device dynamically adjusts a strength of its communication signal based on communication signals it receives from one or more other devices and on measurements performed by the sensor in the given device.

In some embodiments, the sensor includes an optical sensor. And in some embodiments, communication between the devices includes wireless communication.

In some embodiments, positions of the devices are unknown at the beginning of the first mode of operation, and the one or more devices are within a pre-determined distance from the given device. During the first mode of operation, relative positions of the devices may be determined based on strengths of the communication signals and/or times of flight of pulses transmitted and received by the devices. For example, in some embodiments relative positions are determined using radio-acoustic techniques. Furthermore, the final strength may be a difference between the initial strength and a weighted summation of strengths of the received communication signals. And in some embodiments, the command information further includes instructions specifying the initial strength.

In some embodiments, during the first mode of operation dimensions of a border of a region that includes the devices may be determined based on strengths of the communication signals. And during the second mode of operation, the position of an object may be determined based on sensor measurements performed by the devices and strengths of the communication signals in the first mode of operation and in the second mode of operation. For example, the dynamic adjustment of the strength may facilitate lateral inhibition to increase a spatial resolution of a position of the object determined by the devices.

In some embodiments, the object position may be determined using a supervised learning technique, such as a support vector machine (SVM) technique, a classification and regression tree (CART) technique, a nearest neighbor method, and/or a Bayesian classifier. In some embodiments, the position of the object is further determined based on one or more multi-path signals.

In some embodiments, the system further includes a base station having a pre-determined or known location. This base station provides a reference signal that may be used in conjunction with the relative positions to determine absolute positions of the devices.

Another embodiment of the present invention provides a method that includes the first mode of operation and the second mode of operation.

BRIEF DESCRIPTION OF THE FIGURES

Note that like reference numerals refer to corresponding parts throughout the drawings.

DETAILED DESCRIPTION

Figure 1:
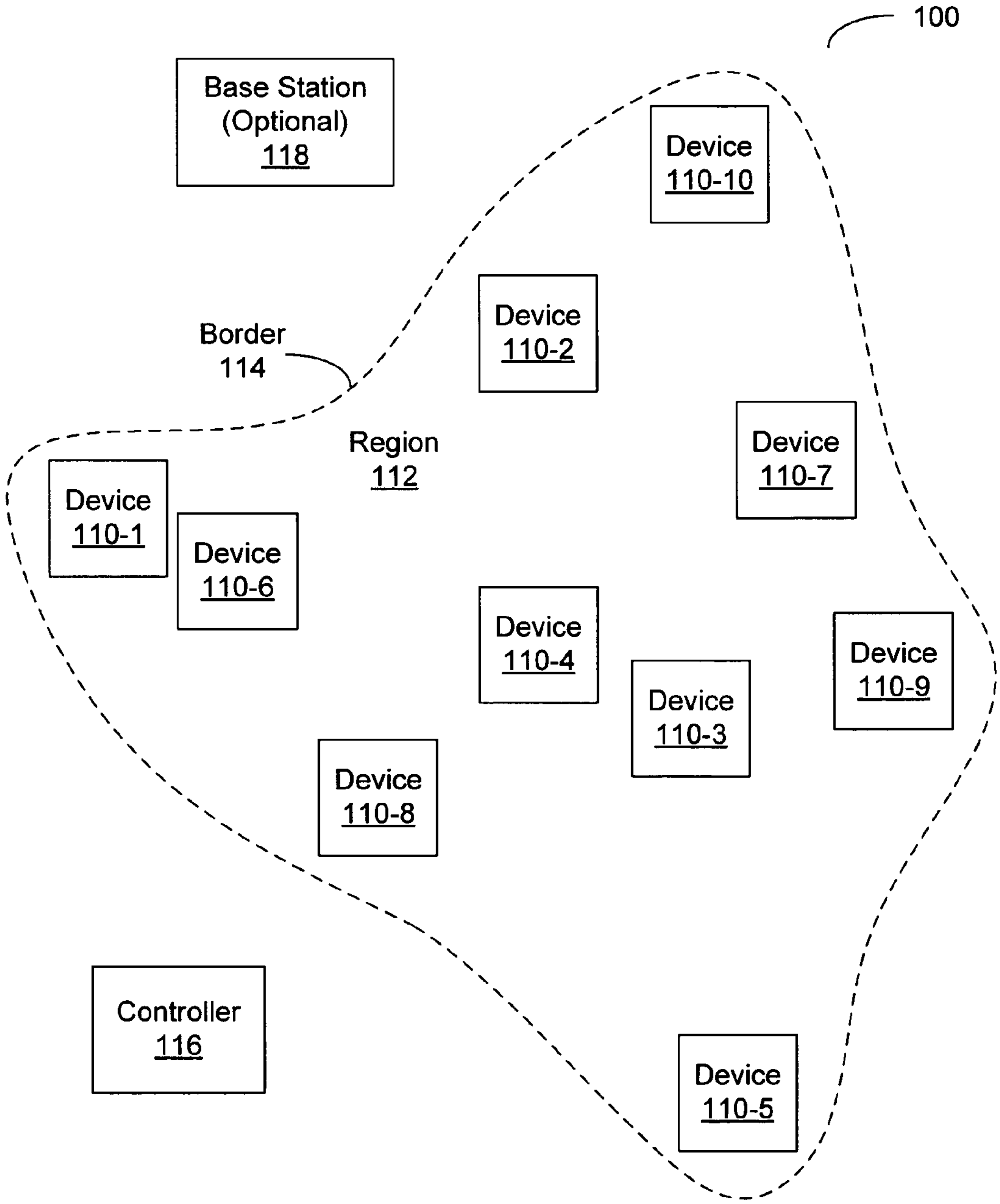
FIG. 1 is a block diagram illustrating an embodiment of a system that includes an array of devices.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method and a system that utilize lateral inhibition are described. In biological systems, lateral inhibition is a technique in which neighboring receptors (such as those in the human visual system) exert an influence on one another. In particular, a given receptor has an excitatory response to whatever target or input it is tuned to detect and an inhibitory response to signals from other receptors. The strength of the signals from the other receptors declines with distance such that the influence of neighboring receptors is stronger than that of receptors that are further away. Lateral inhibition is a form of negative feedback control that enhances differences in the responses of receptors. In addition, the average effect of many receptors acting on one another stabilizes the output from the system. In the context of the embodiments of the system described below, it also reduces the effect of noise sources and interference signals.

The system and method include multiple modes of operation. In a "calibration mode" of operation, devices are instructed by a controller to transmit communication signals. The communication signal from a given device in the devices has an initial strength. This first strength is modified to a final strength based on the strengths of communication signals received from one or more neighboring devices during the calibration mode of operation, thereby implementing lateral inhibition. Relative positions of the devices may be determined using the final strengths of the communication signals in the calibration mode. Furthermore, if a base station that has a known position also provides a reference signal, the absolute positions of the devices may be determined.

In a "position-tracking mode" of operation, the devices are once again instructed by the controller to transmit communication signals. The strength of the communication signal from the given device is dynamically adjusted based on the strengths of communication signals received from one or more neighboring devices during the position-tracking mode of operation and measurements performed by a sensor in the given device. This feedback also implements lateral inhibition and increases the spatial resolution of measurements performed using sensors in the devices. In particular, if the sensors are optical sensors, a position of an object may be determined using the strengths of communications signals in the two calibration and position-tracking modes of operation.

The embodiments of the lateral inhibition technique and system may be used in a variety of system configurations including arrays of devices or sensors that have known positions. For example, the lateral-inhibition techniques may be used in conventional arrays of sensors, such as Charge-Coupled Devices (CCD) or Complementary Metal Oxide Semiconductor (CMOS) sensors. Alternatively, the positions may, at least initially, be unknown, such as in an ad hoc or random sensor network. In some embodiments, at least some of the sensors or devices are mobile, i.e., their positions may change as a function of time. Furthermore, the devices may include many different types of sensors, such environmental sensors (temperature, pressure, wind speed or direction, precipitation, and/or humidity sensors), energy sensors (radiation, wind, and/or wave sensors), chemical sensors, biological sensors (for example, sensors that utilize Polymerase Chain Reaction), medical sensors, position sensors (such as radio frequency identification tags or sensors), kinetic energy sensors (for example, velocity and/or acceleration sensors), electrical sensors, magnetic sensors, thermal sensors, electromagnetic sensors in one or more spectral bands (such as Infrared or optical sensors), as well as other types of sensors.

We now describe embodiments of a system that includes lateral inhibition. FIG. 1 is a block diagram illustrating an embodiment of a system 100 that includes an array of devices 110. These devices 110 are located in a region 112 that has a border 114. In some embodiments, positions of the devices 110 are random and are initially unknown, in which case the border 114 is also initially unknown.

The devices 110 each include at least one sensor (such as an optical sensor) and are configured to communicate with other devices. For example, a given device, such as device 110-4, may communicate with one or more of the devices 110 that are within a pre-determined distance from the device 110-4. The pre-determined distance may be 1, 5, 10, 500, 500, 1000, 5000, and/or 10,000 m, or more. Communication over such a pre-determined distance is described further below with reference to FIG. 2.

Communication between devices 110 may utilize wired or wireless communication, and may include signals that have one or more carrier frequencies or bands of frequencies. In embodiments that utilize wireless communication, such communication may include protocols or standards such as IEEE 802.11 (WiFi), High Performance Radio Local Area Network (HIPERLAN), IEEE 802.16 (WiMAX), Bluetooth, Digital Enhanced Cordless Communications (DECT), Dedicated Short Range Communications (DSRC), IEEE 802.15.4 (ZigBee), Time Division Multiple Access (TDMA), Frequency Division Multiple Access (FDMA), Global System for Mobile Communication (GSM), Code Division Multiple Access (CDMA), other cellular telephone standards, time domain multiplexing, frequency domain multiplexing, and/or spread spectrum signaling.

The system 100 may include a controller 116, which communicates with the devices 110 and provides command information to the devices 110. Such command information may specify a mode of operation of the devices 110, including a calibration mode of operation and a sensor-measurement mode of operation. In these modes of operation, communication between the devices 110 may include lateral inhibition.

For example, in the calibration mode of operation the devices 110 may each transmit communication signals, and the given device may modify an initial strength ($I_o$) of its communication signal based on strengths of signals it receives from neighboring devices during this mode of operation. In one embodiment, the final strength ($I_f$) of the communication signal from this device is a difference between the initial strength and a weighted summation of strengths ($\{I_i\}$) of a set of communication signals received from neighboring devices, i.e., $I_f = I_o - \Sigma\gamma_i I_i$ (where $\gamma_i$ is a weight). Note that more generally the final strength is a function of the initial strengths and the strengths of the set of communication signals, i.e., $I_f = F(I_o, \{I_i\})$. Furthermore, in some embodiments the command information may specify initial strengths of the communication signals transmitted by one or more of the devices 110 by individually addressing these devices. This may allow different initial strengths to be used by different devices, which may allow particular devices to be selectively isolated and a topology of the array to be determined.

Similarly, in the sensor-measurement mode of operation the devices 110 may each transmit communication signals, and the given device may dynamically adjust an initial strength of its communication signal based on strengths of signals it receives from neighboring devices during this mode of operation. For example, in one embodiment the final strength is a difference between the initial strength and a weighted summation of strengths of a set of communication signals received from neighboring devices. However, the strength of the communication signal from the given device is also dynamically adjusted based on measurements performed using the sensor in the given device. Dynamic adjustment of the strength may be continuous or after a pre-determined time interval (such as 1, 5, 10, 60, 600, 1800 and/or 6000 s, or more), and may be performed one or more times. Illustrations of embodiments of the calibration mode of operation are described below with reference to FIGS. 6A-7B, and illustration of embodiments of the sensor-measurement mode of operation are described below with reference to FIGS. 8A-8B.

The controller 116 may aggregate information from the devices 110 in these modes of operation, thereby enabling collaborative processing. For example, the controller 116 may determine relative positions of the devices (such as if the given device is nearer to device A than device B) using the final strengths of the communication signals in the calibration mode of operation. As illustrated below with reference to FIGS. 6B and 7B, such strengths may also be used to determine the border 114. Furthermore, in some embodiments, absolute positions of the devices 110 may be determined using the reference positions in conjunction with a reference signal provided by at least one optional base station 118, which has a known position. For example, the reference signal may specify an orientation or a direction, such as North. In other embodiments, the devices 110 may determine their orientations using the earth's magnetic field. Note that the communication with the base station 118 and/or the controller 116 may not lead to changes in the strengths of the communication signals from the devices 110.

And in some embodiments, relative and/or absolute positions of the devices may be determined based on times of flight of pulses transmitted and received by the devices 110, for example, using techniques such as trilateration and/or triangulation, as is known in the art.

Alternatively, in the sensor-measurement mode of operation, the controller 116 may enhance a spatial resolution of measurements that are performed by the devices 110, such as optical measurements of a position of an object. For example, the position of the object at a given instant in time or after a time interval may be determined using the final signal strengths in the calibration and the sensor-measurement modes of operation, which is described further below with reference to FIGS. 8A and 8B.

The system 100 may include fewer or additional components. For example, while the system 100 is illustrated with the controller 116, in other embodiments the devices 110 may be self-organized, i.e., there may not be a separate controller 116. In such embodiments, the function of the controller 116 may be implemented by one or more of the devices 110. In other embodiments, the controller 116 and the base station 118 are combined. Furthermore, two or more components may be combined into a single component, and a position of one or more components may be changed.

Figure 2:
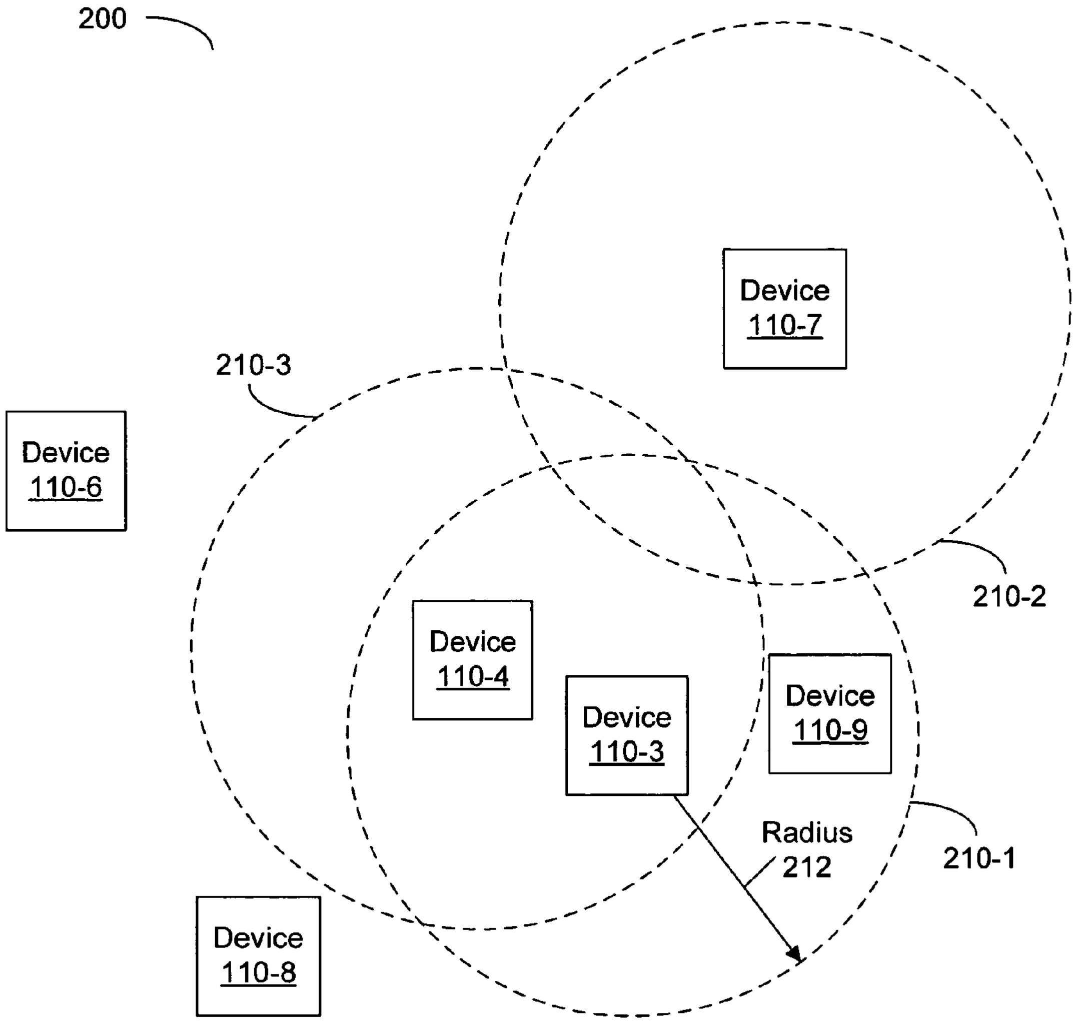
FIG. 2 is a block diagram illustrating an embodiment of communication between devices in the array.

FIG. 2 is a block diagram illustrating an embodiment 200 of communication between devices 110 in the array. As discussed above, the given device may communicate with other devices within the pre-determined distance. For example, the device 110-3 may communicate with device 110-4 and 110-9 that are within a region 210-1 of radius 212. Other devices 110 have corresponding regions 210 of communication. The radius 212 may, at least in part, be determined by the strength of the communication signal(s) transmitted by the device 110-3. For example, if the strength corresponds to an intensity or power, the region 210-1 of effective communication is proportional to an inverse of the radius 212 to the nth power, where n may be between 2 and 3. In other embodiments, the strength is a magnitude of an amplitude of the communication signal.

Figure 3:
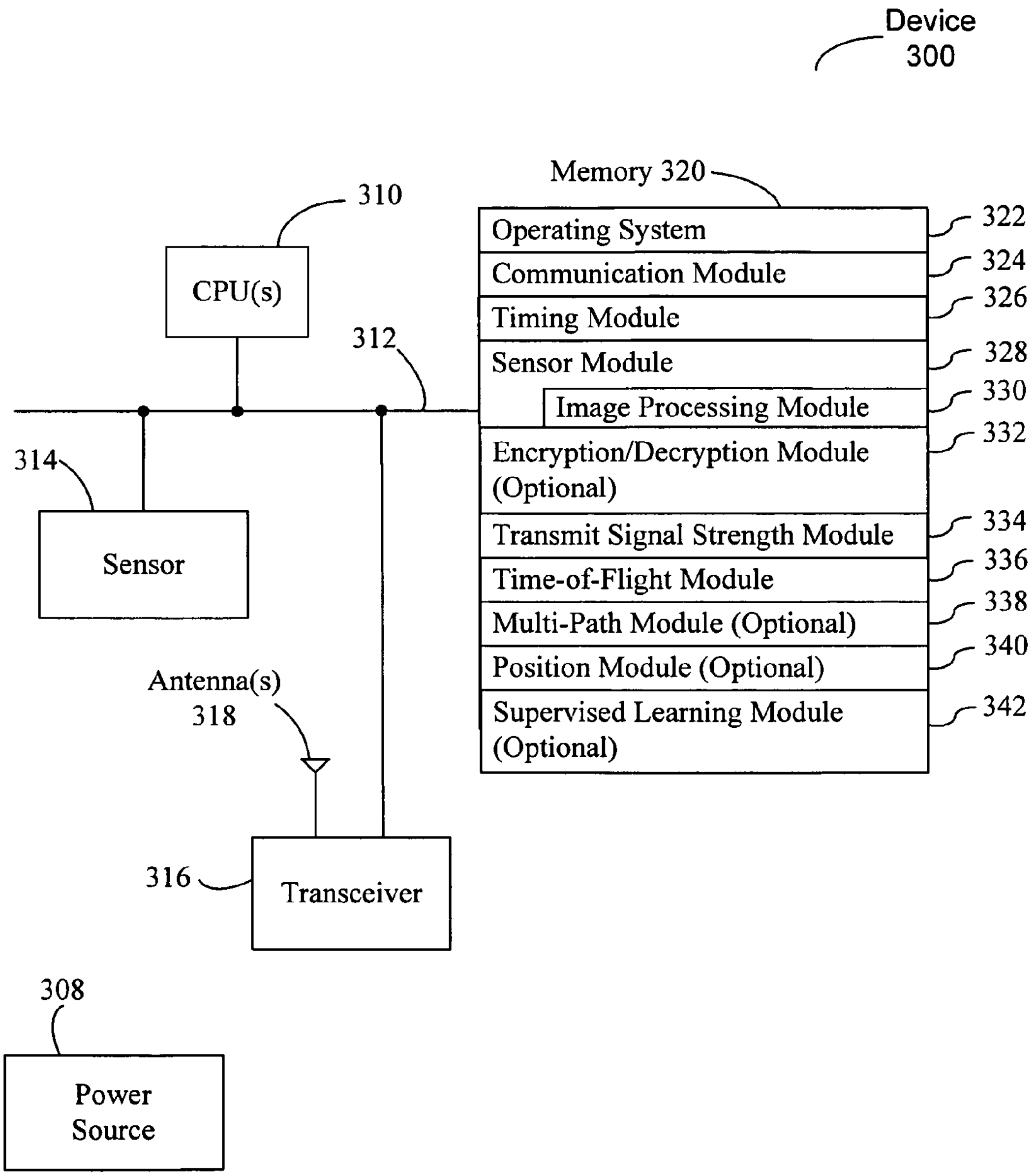
FIG. 3 is a block diagram illustrating an embodiment of a device.

FIG. 3 is a block diagram illustrating an embodiment of a device 300 (such as one of the devices 110 in FIG. 1), which includes one or processors 310, a transceiver 316, one or more antennas 318, a sensor 314, and one or more signal lines 312 coupling these components together. Note that the one or more processing units 310 may support parallel processing and/or multi-threaded operation, the transceiver 316 may provide a communication interface that has a persistent communication connection, and the one or more signal lines 312 may constitute a communication bus. Moreover, the device 300 may include a power source 308, such as a solar cell, a fuel cell, or a battery, that provides power to other components in the device 300.

The device 300 may include memory 320, which may include high speed random access memory and/or non-volatile memory. More specifically, memory 320 may include ROM, RAM, EPROM, EEPROM, FLASH, one or more smart cards, one or more magnetic disc storage devices, and/or one or more optical storage devices. Memory 320 may store an embedded operating system 322, such as SOLARIS, LINUX, UNIX, OS X, PALM or WINDOWS, or a real-time operating system (such as VxWorks by Wind River System, Inc.) suitable for use in industrial or commercial devices. The operating system 322 includes procedures (or a set of instructions) for handling various basic system services for performing hardware dependent tasks, such as power management. The memory 320 may also store procedures (or a set of instructions) in a communication module 324. The communication procedures may be used for communicating with one or more additional devices, the controller 116 (FIG. 1), as well as computers and/or servers, including computers and/or servers that are remotely located with respect to the device 300.

Memory 320 may also include variety of modules (or sets of instructions) including a timing module 326 (or a set of instructions) that provides a temporal reference and/or synchronization for transmitted and/or received signals, as well as a sensor module 328 (or a set of instructions) that controls measurements performed by the sensor 314. An optional encryption/decryption module 332 (or a set of instructions) in the memory 320 provides secure communication of information, and a transmit signal strength module 334 (or a set of instructions) analyzes strengths of received signals.

Furthermore, the memory 320 may include a time-of-flight module 336 (or a set of instructions) that determines the time-of-flight of received pulses, and an optional multi-path module 338 (or a set of instructions) that analyzes received multi-path signals. In some embodiments, positions of the devices 110 (FIG. 1) and/or an object are at least partially determined using time-of-flight and/or multi-path information. For example, multi-path signals are a function of the geometry of the devices and/or the object, as well as the topography around the devices. Such signals are often delayed and suffer a loss of power in the reflection process relative to direct-path signals. Multi-path signals may be determined, and their effects either minimized or used to advantage, using techniques such as early-minus late correlation, W-discriminators, and/or one or more synchronous detectors (for example, a Viterbi detector).

An optional position module 340 (or a set of instructions) in the memory 320 determines relative or absolute positions of other devices, and an optional supervised learning module 342 (or a set of instructions) analyzes sensor 314 measurements using strengths of signals received by the device 300 during the calibration and sensor-measurement modes of operation. The use of the supervised learning techniques in analyzing lateral inhibition data is discussed further below with reference to FIGS. 8A and 8B. Note that the sensor module 328 may include an image processing mode 330 (or a set of instructions) in embodiments where the sensor 314 is an optical sensor. Moreover, using one or more of these modules, the device 300 may implement lateral inhibition in one or more modes of operation.

Instructions in the modules in the memory 320 may be implemented in a high-level procedural language, an object-oriented programming language, and/or in an assembly or machine language. The programming language may be complied or interpreted, i.e., configurable or configured to be executed by the one or more processing units 310.

The device 300 may include fewer components or additional components, two or more components may be combined into a single component, and/or a position of one or more components may be changed. In some embodiments, the functionality of the device 300 may be implemented more in hardware and less in software, or less in hardware and more in software, as is known in the art.

Although the device 300 is illustrated as having a number of discrete items, FIG. 3 is intended to be a functional description of the various features that may be present in the device 300 rather than as a structural schematic of the embodiments described herein. In practice, and as recognized by those of ordinary skill in the art, the functions of the device 300 may be distributed over a large number of devices, with various groups of the devices performing particular subsets of the functions. In some embodiments, some or all of the functionality of the device 300 may be implemented in one or more application specific integrated circuits (ASICs) and/or one or more digital signal processors (DSPs).

Figure 4:
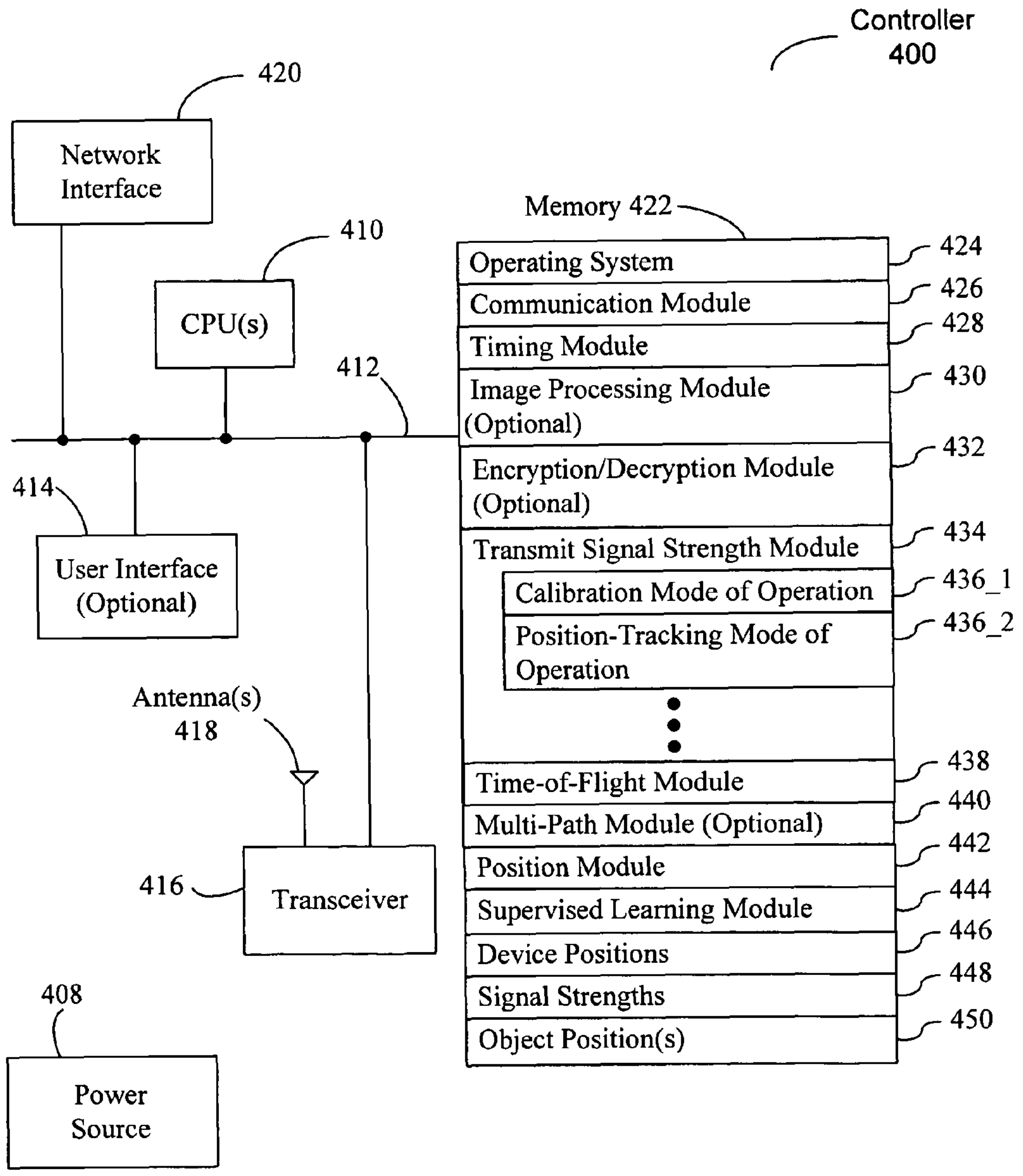
FIG. 4 is a block diagram illustrating an embodiment of a controller.

FIG. 4 is a block diagram illustrating an embodiment of a controller 400 (such as the controller 116 in FIG. 1), which includes one or more processors 410, a transceiver 416, one or more antennas 418, an optional user interface 414, a network interface 420, and one or more signal lines 412 coupling these components together. Note that the one or more processing units 410 may support parallel processing and/or multi-threaded operation, the network interface 420 and/or the transceiver 416 may provide a communication interface that has a persistent communication connection, and the one or more signal lines 412 may constitute a communication bus. Moreover, the controller 400 may include a power source 408, such as a solar cell, fuel cell, or a battery, that provides power to other components in the controller 400.

The controller 400 may include memory 422, which may include high speed random access memory and/or non-volatile memory. More specifically, memory 422 may include ROM, RAM, EPROM, EEPROM, FLASH, one or more smart cards, one or more magnetic disc storage devices, and/or one or more optical storage devices. Memory 422 may store an embedded operating system 424, such as SOLARIS, LINUX, UNIX, OS X, PALM or WINDOWS, or a real-time operating system (such as VxWorks by Wind River System, Inc.) suitable for use in industrial or commercial devices. The operating system 424 includes procedures (or a set of instructions) for handling various basic system services for performing hardware dependent tasks, such as power management. The memory 422 may also store procedures (or a set of instructions) in a communication module 426. The communication procedures may be used for communicating with one or more devices (such as the device 300 in FIG. 3), as well as computers and/or servers, including computers and/or servers that are remotely located with respect to the controller 400.

Memory 422 may also include a timing module 428 (or a set of instructions) that provides a temporal reference and/or synchronization for transmitted and/or received signals, and an optional image processing module 430 (or a set of instructions) in embodiments where sensors in devices (such as the device 300 in FIG. 3) include optical sensors. An optional encryption/decryption module 432 (or a set of instructions) in the memory 422 provides secure communication of information, and a transmit signal strength module 434 (or a set of instructions) provides initial strengths of the communication signals to the devices and receives final strengths of the communication signals from the devices. As a consequence, the transmit signal strength module 434 includes instructions for a calibration mode of operation 436_1 and a sensor-measurement mode of operation, such as position-tracking mode of operation 436_2. As discussed further below with reference to FIGS. 8A-8B, in the position-tracking mode of operation 436_2, optical measurements performed by the sensors in the devices may be used in conjunction with strengths of signals in the calibration and position-tracking modes of operation 436 to determine one or more positions of an object. In an exemplary embodiment, the positions of the object are determined using a supervised learning algorithm, such as a support vector machine technique, a classification and regression tree technique, a nearest neighbor method, and/or a Bayesian classifier (such as one based on the Expectation Maximization procedure). In particular, the positions of the object are determined using a probabilistic classifier.

Furthermore, the memory 422 may also include a time-of-flight module 438 (or a set of instructions) that determines the time-of-flight of received pulses, and an optional multi-path module 440 (or a set of instructions) that analyzes received multi-path signals. A position module 442 (or a set of instructions) in the memory 422 determines relative or absolute positions of the devices, and (as discussed above) a supervised learning module 444 (or a set of instructions) may determine positions of the object based on measurements performed by the sensors in the devices and the strengths of signals from the devices in the calibration and position-tracking measurement modes of operation 436. Note that the memory 422 may also include data structures, such as relative or absolute device positions 446, signal strengths 448 in one or more modes of operation 436, and object positions 450.

Instructions in the modules in the memory 422 may be implemented in a high-level procedural language, an object-oriented programming language, and/or in an assembly or machine language. The programming language may be complied or interpreted, i.e., configurable or configured to be executed by the one or more processing units 410.

The controller 400 may include fewer components or additional components, two or more components may be combined into a single component, and/or a position of one or more components may be changed. In some embodiments, the functionality of the controller 400 may be implemented more in hardware and less in software, or less in hardware and more in software, as is known in the art.

Although the controller 400 is illustrated as having a number of discrete items, FIG. 4 is intended to be a functional description of the various features that may be present in the controller 400 rather than as a structural schematic of the embodiments described herein. In practice, and as recognized by those of ordinary skill in the art, the functions of the controller 400 may be distributed over a large number of controllers, computers and/or servers. For example, various groups of controllers may perform particular subsets of the functions of the controller 400. In some embodiments, some or all of the functionality of the controller 400 may be implemented in one or more application specific integrated circuits (ASICs) and/or one or more digital signal processors (DSPs).

Figure 5:
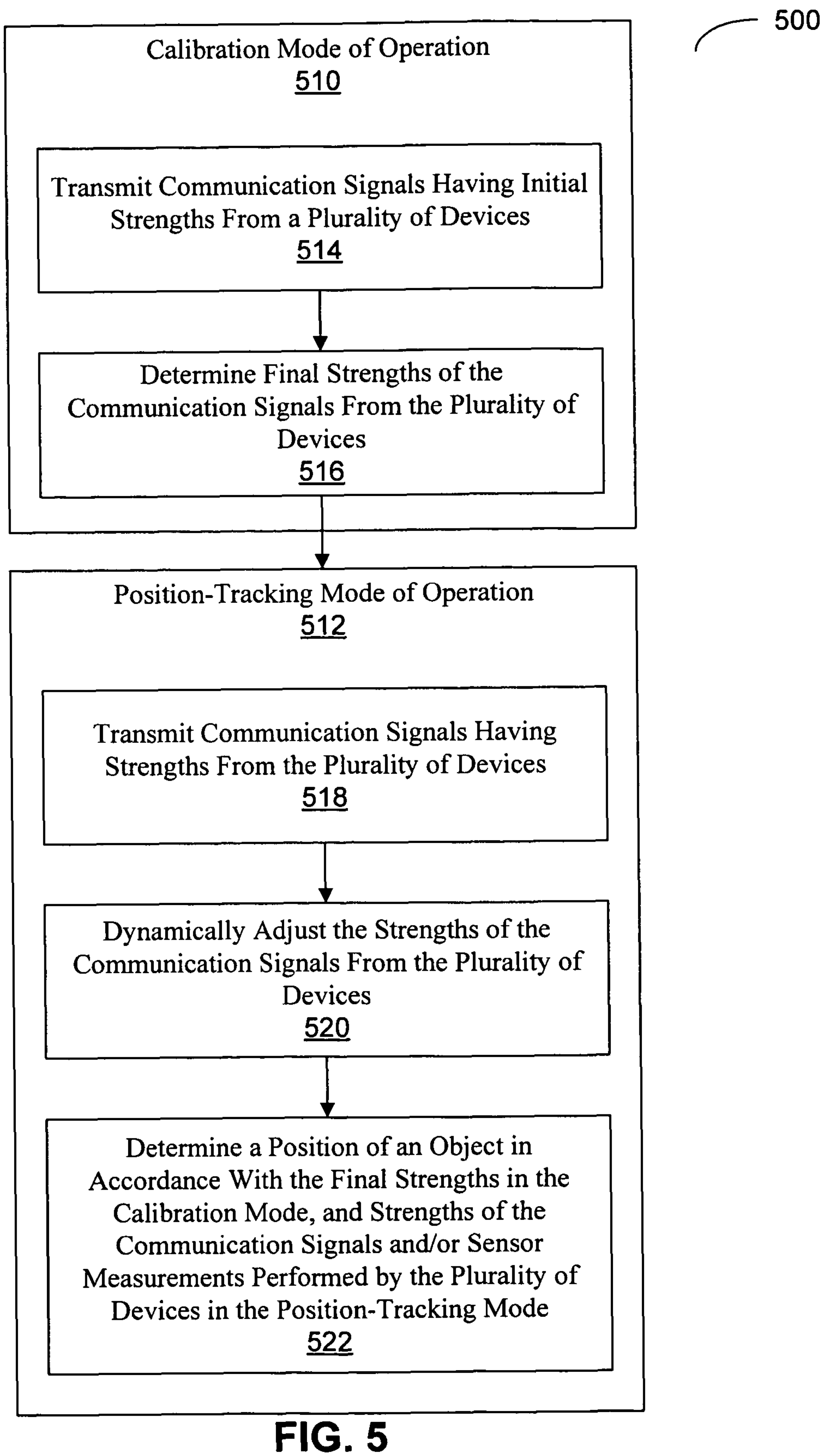
FIG. 5 is a flow chart illustrating an embodiment of a process that includes two modes of operation.

We now discuss methods for sensor localization using lateral inhibition. FIG. 5 is a flow chart illustrating an embodiment of a process 500 that includes two modes of operation. In a calibration mode 510, communication signals having initial strengths are transmitted from a plurality of devices (514), and final strengths of the communication signals to be transmitted from the plurality of devices are determined (516). For example, a final strength of a communication signal from the given device may be determined based on the strengths of signals it receives from other devices during the calibration mode of operation 510.

In a sensor-measurement mode of operation, such as a position-tracking mode of operation 512, communication signals having strengths are transmitted from the plurality of devices (518) and the strengths of the communication signals are dynamically adjusted (520). For example, a strength of a communication signal from the given device may be adjusted based on measurement it performs using a sensor and the strengths of signals it receives from other devices in the position-tracking mode of operation 512. During this process, a position of an object is determined in accordance with the final strengths of the communication signals in the calibration mode, and strengths of the communication signals and/or sensor measurements performed by the plurality of devices (522) in the sensor-measurement mode. In some embodiments, there may be additional or fewer operations, the order of the operations may be changed, and two or more operations may be combined into a single operation. For example, the calibration mode of operation 510 may be performed once, after a pre-determined time interval (such as daily, weekly, or monthly), or as needed based on the performance of an array of devices.

Figure 6A:
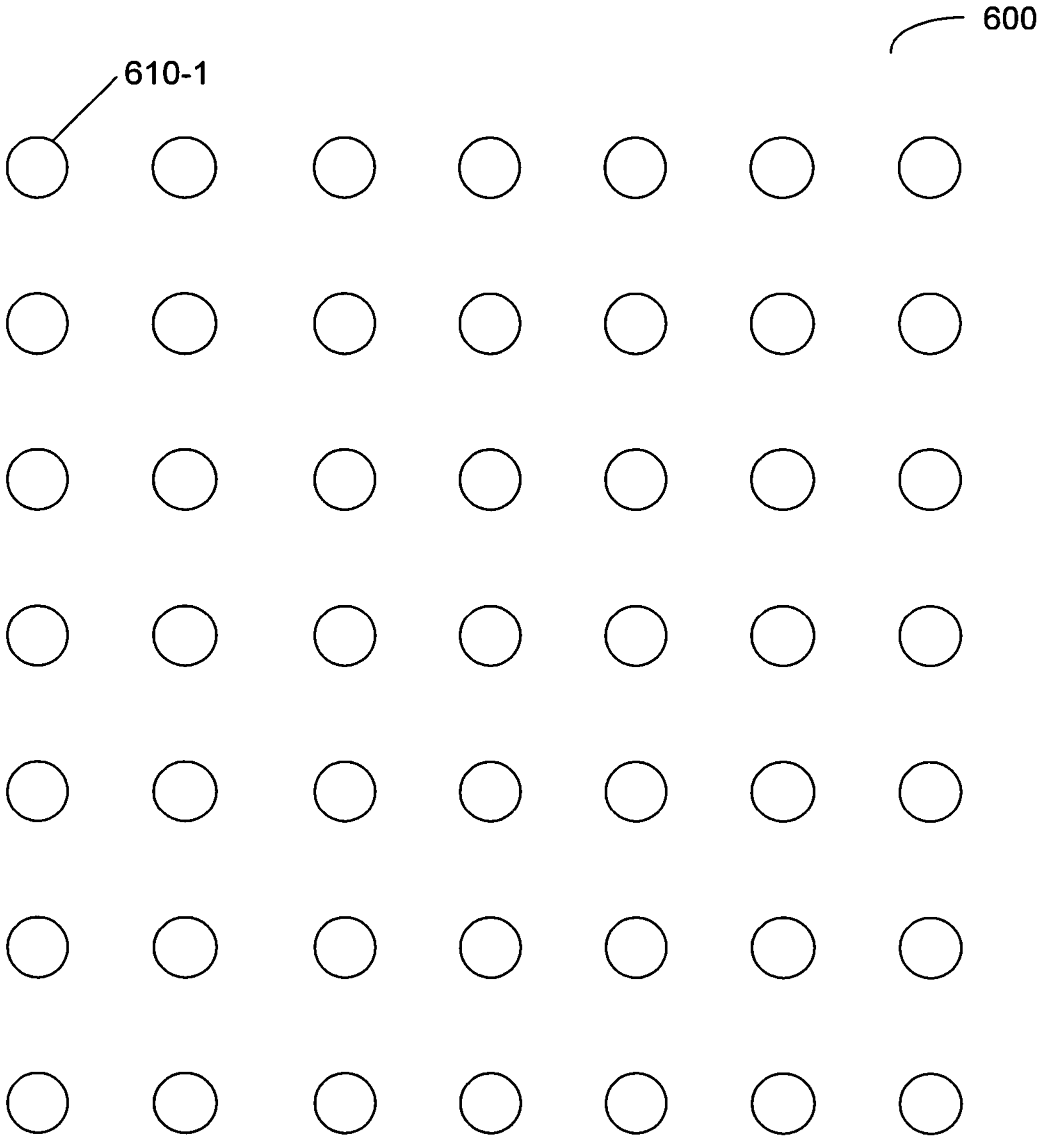
FIG. 6A is a block diagram illustrating an embodiment of strengths of communication signals from devices in an ordered array.

We now discuss illustrative embodiments of the method and system that utilize lateral inhibition. FIG. 6A is a block diagram illustrating an embodiment 600 of strengths of communication signals from devices in an ordered array at the start of the calibration mode of operation. As indicated by the uniform (white) shading 610-1 of the devices, the strengths of the communication signals from the devices are initially the same.

Figure 6B:
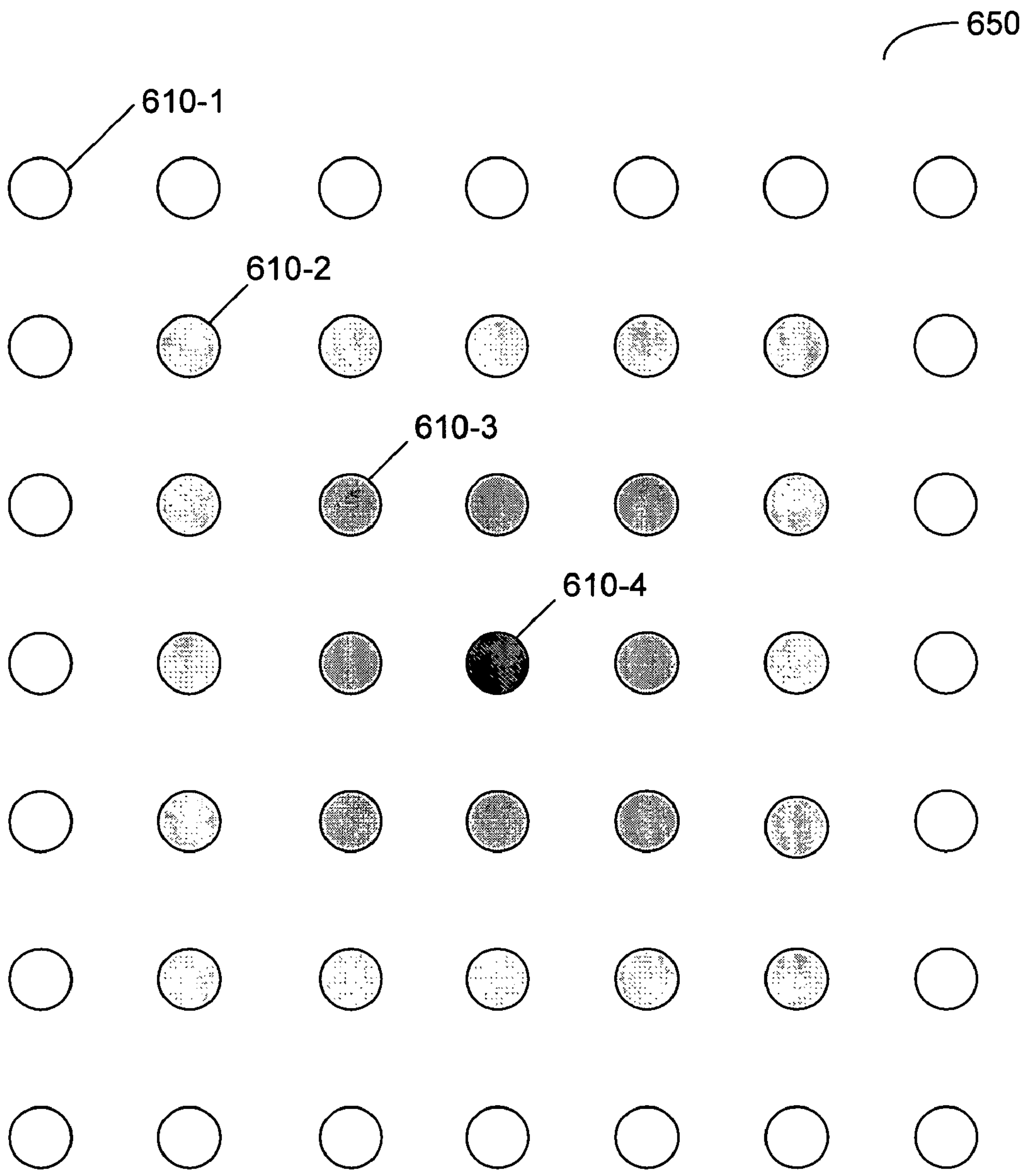
FIG. 6B is a block diagram illustrating an embodiment of strengths of communication signals from devices in the ordered array.

As illustrated in embodiment 650 in FIG. 6B, the devices may modify the strengths of the communication signals based on signals received from other devices. For example, strengths of the communication signals may be modified based on the strengths of received signals. Devices that have more neighbors or that are closer to the center of the array have lower strengths. As a consequence, the strengths of the communication signals vary across the array. This is illustrated by shadings 610. Note that the strength is largest at the border of the array and smallest at the center. Furthermore, in some embodiments the strengths may have a discrete distribution (such as that associated with quantized bins) or a continuous distribution.

Thus, the strengths of the communication signals provide relative position information, such as where the given device is in the array. In addition, the strengths of the communication signals determine the border of the array. This information may be useful in applications where the devices are used to monitor intrusion across the border into a region.

While not illustrated in embodiment 600 and 650, in other embodiments, the controller 116 (FIG. 1) may instruct one or more of the devices to initially utilize an initial strength of its communication signal that is different than that of the other devices. For example, the given device may utilize a larger strength and/or a different carrier frequency in order to focus on the given device. If a range of strengths are used over time, the relative position of the given device and its neighbors may be determined with better precision. This approach may also be applied iteratively to other devices in the array. Furthermore, embodiments that allow individual devices to transmit communication signals (as opposed to all of the devices transmitting simultaneously) may be useful in environments with interference signals, such as multi-path signals.

Figure 7A:
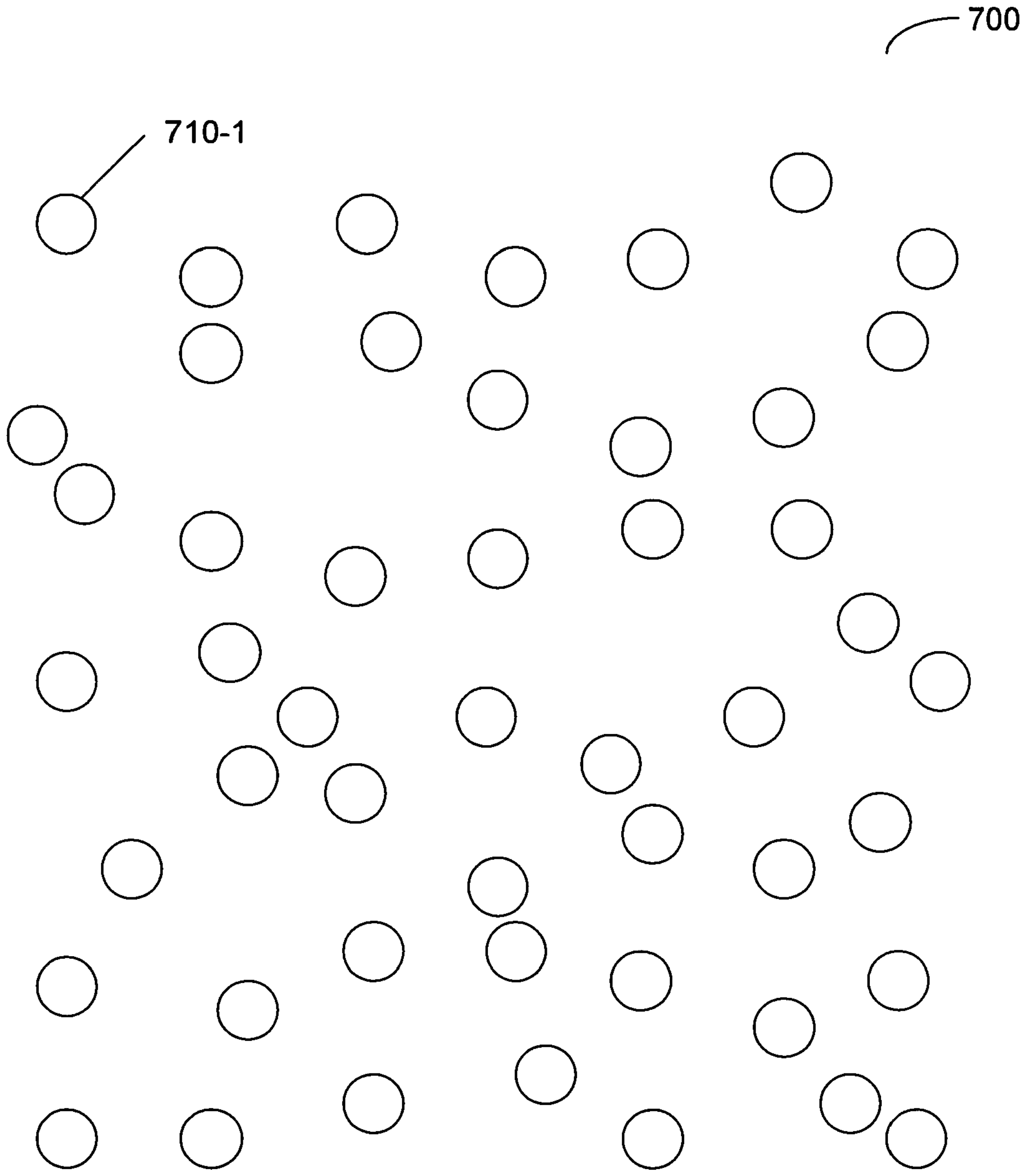
FIG. 7A is a block diagram illustrating an embodiment of strengths of communication signals from devices in a random array.

As discussed previously, in some embodiments the devices may have a random placement. This is illustrated in FIG. 7A, which provides an embodiment 700 of strengths of communication signals from devices in a random array at the start of the calibration mode of operation. As indicated by the uniform (white) shading 710-1 of the devices, the strengths of the communication signals from the devices are initially the same.

Figure 7B:
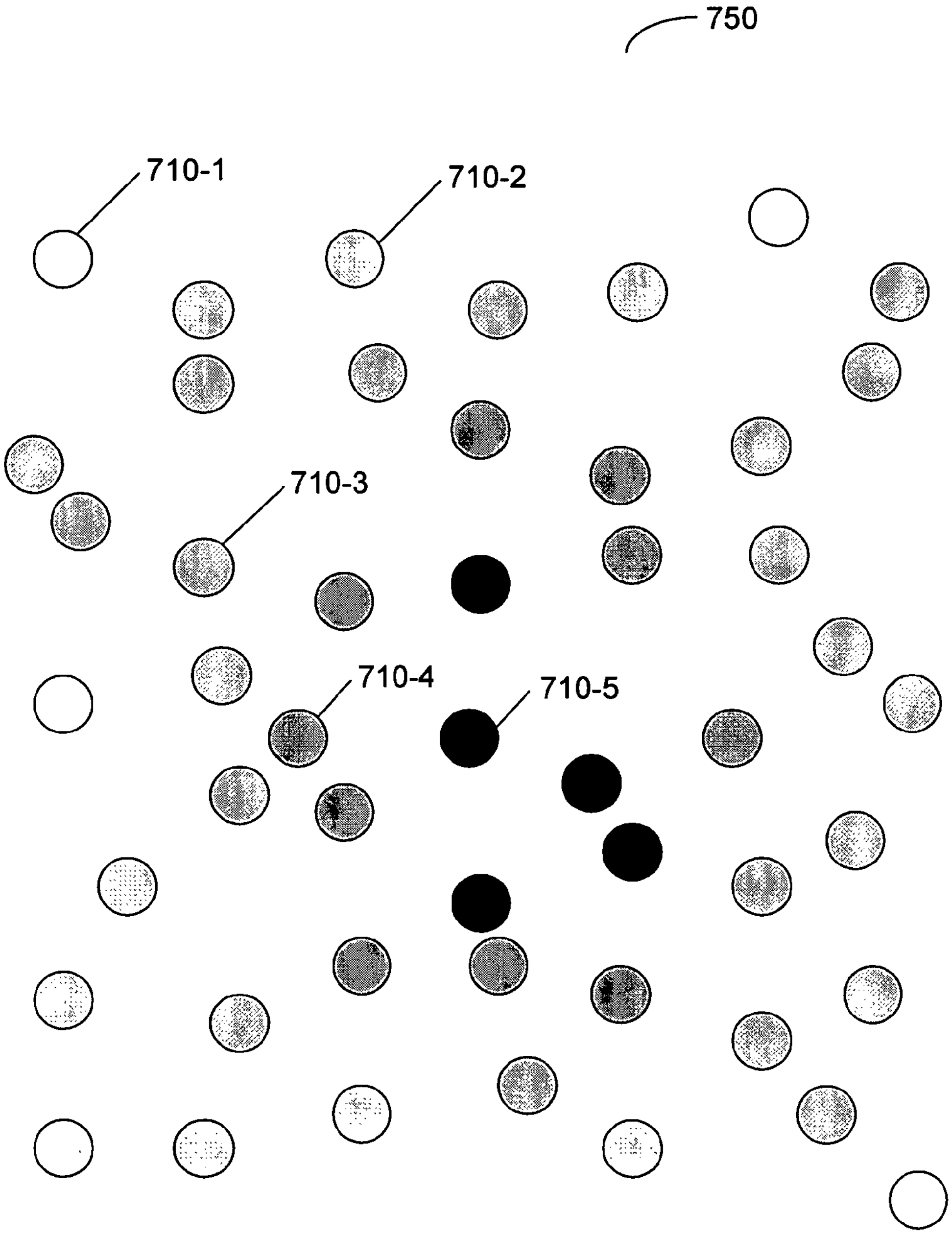
FIG. 7B is a block diagram illustrating an embodiment of strengths of communication signals from devices in the random array.

The devices may modify their signal strengths based on signals received from other devices, which is illustrated in embodiment 750 in FIG. 7B. As in embodiment 650 (FIG. 6B), devices that have more neighbors or that are closer to the center of the array have lower strengths. However, in embodiment 750 the strengths of the communication signals are also a function of the distance or proximity to other devices. Shadings 710 provide an illustration of the variation in the strengths of the communication signals across the array.

When the device positions in the array are random, using the strengths of the communication signals is more complicated. Thus, the border of the array is less well defined relative to embodiment 650 (FIG. 6B). Furthermore, the presence of noise and interference effects (due to variations in the devices during manufacturing and/or over time, as well as differences in the local environments around the devices) in embodiments 650 (FIG. 6B) and 750 also makes the mapping from strengths to relative positions of the devices more difficult. As discussed below with reference to FIGS. 8A and 8B, an alternative approach uses the strengths of the communication signals, in part, to determine probabilities for the sensors in the devices. These probabilities may be used in a supervised learning algorithm, such as a Bayesian classifier, to determine positions of objects using the array.

Figure 8A:
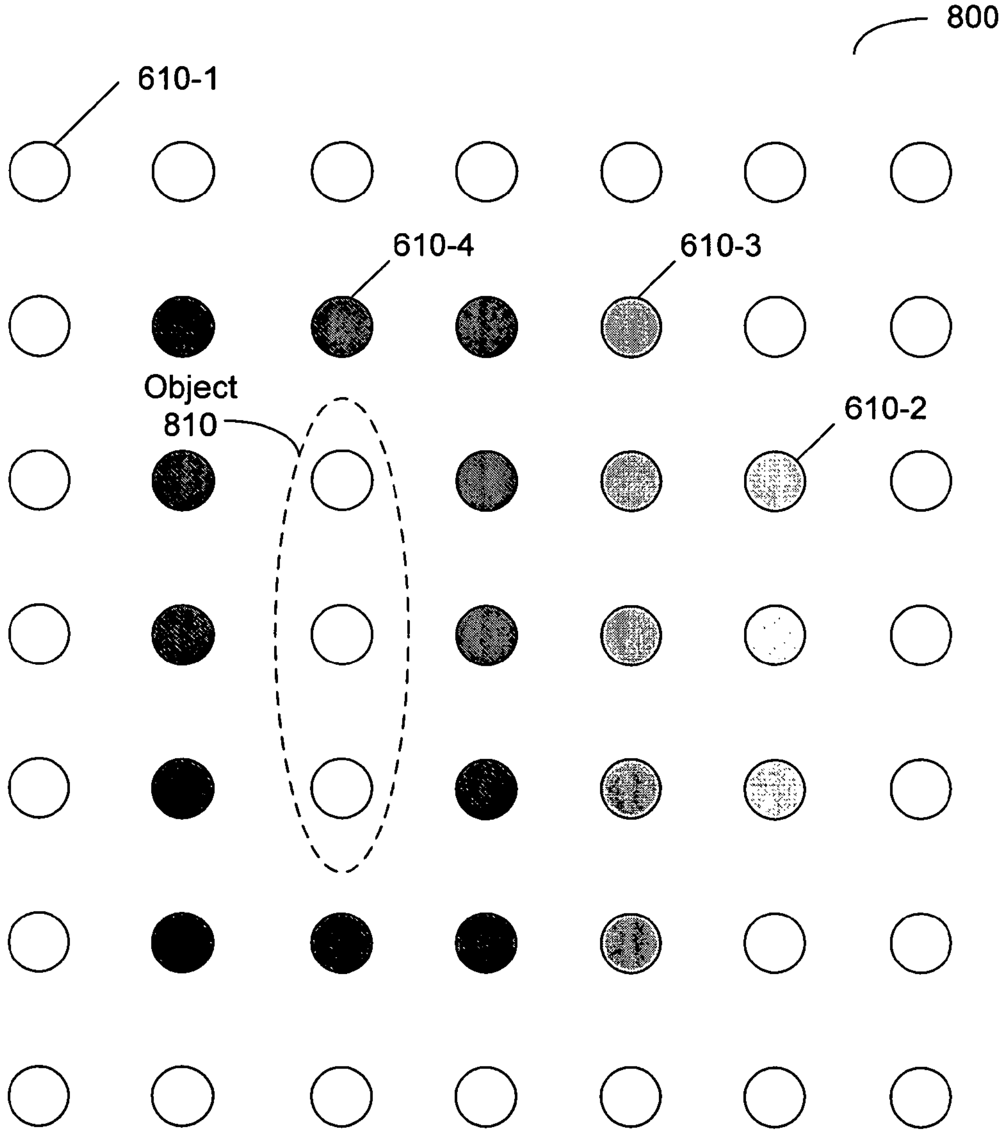
FIG. 8A is a block diagram illustrating an embodiment of strengths of communication signals from devices in the ordered array.
Figure 8B:
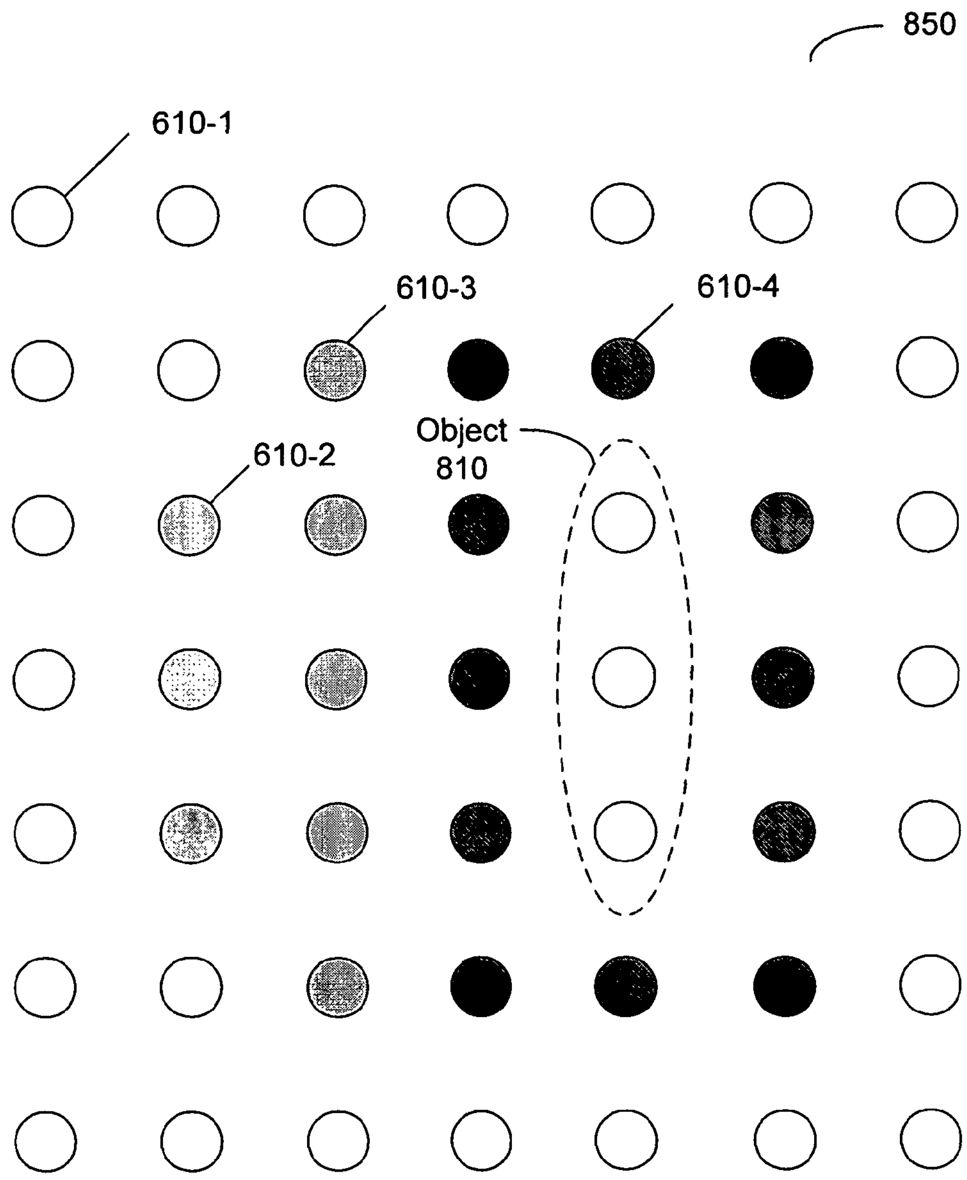
FIG. 8B is a block diagram illustrating an embodiment of strengths of communication signals from devices in the ordered array.

FIG. 8A is a block diagram illustrating an embodiment 800 of strengths of communication signals from devices in the ordered array during the position-tracking mode of operation. For the given device, a strength of its communication signal may be determined based on strengths of communication signals it receives from other devices and measurements performed by a sensor in the given device (such as an optical sensor). The variations in the strengths across the array (illustrated by the shadings 610) allow a position of an object 810, such as a light beam that illuminates a portion of the array or an airplane flying over the array, to be determined. As the position of the object 810 changes, the strengths of the communication signals change accordingly. This is illustrated in FIG. 8B, which provides an embodiment 850 of strengths of communication signals from devices in the array. Note that as the object 810 moves across the array not only are the strengths of the communication signals from the receiving devices increased, but the strengths of the communication signals from neighboring devices are simultaneously decreased. Thus, embodiments 800 (FIG. 8A) and 850 illustrate lateral inhibition to improve the spatial resolution in the determined position of the object 810.

In some embodiments, a known moving object or target is used during the position-tracking mode of operation to further calibrate the array. For example, the known moving object may shine collimated light or a pre-defined magnetic field onto the devices. Furthermore, in the embodiments 800 and 850 (as well as in the previous embodiments) lateral inhibition may be used to modify radio signal strengths during certain time intervals. At other times, however, a full-strength signal may be utilized, such as when one or more of the devices is communicating with a controller or a base station.

In other embodiments, strengths of measurements from the devices are dynamically adjusted based on signals received from other devices. In these embodiments, the strength of the communication signal from the given device corresponds to the measurement made with its sensor. Thus, the shading 610 in embodiments 800 (FIG. 8A) and 850 may correspond to the strength of the measurements as opposed to the strengths of the communication signals.

While not shown in embodiments 800 (FIG. 8A) and 850, the presence of noise and interference signals, as well as variations in the device positions may complicate the analysis. Therefore, in general a supervised learning algorithm, an unsupervised learning algorithm and/or a partially supervised learning algorithm may be used to determine the position of the object 810. A Bayesian classifier is used in an exemplary embodiment. Embodiments of such a probabilistic classifier may be used in the presence of a variety of types of noise.

Consider the problem of classifying states of the array of N devices based on a set $\{F_i\}$ that includes the strengths of the communication signals in a first state with an object or a second state without an object. Assuming that the probabilities of the strengths of the communication signals are independent of one another, the probability that the ith strength $F_i$ is in a given class or state is $$p(F_i|C),$$

and the probability that the set $\{F_i\}$ is in the given class is $$p\left(\{F_i\}|C\right) = \prod_{i=1}^{N} p\left(F_i|C\right).$$

The question we wish to answer is what is the probability that a given set $\{F_i\}$ corresponds to class C?

Using the definition of conditional probability, we have $$p(\{F_i\} \mid C) = \frac{p(\{F_i\} \cap C)}{p(C)},$$

and $$p(C \mid \{F_i\}) = \frac{p(C \cap \{F_i\})}{p(\{F_i\})}.$$

Applying Bayes theorem, we re-expresses the probability as a likelihood, i.e., $$p(C \mid \{F_i\}) = \frac{p(C)}{p(\{F_i\})} p(\{F_i\} \mid C).$$

Furthermore, if we assume that there are two classes, one with an object $C_O$ and one without an object $C_{WO}$, then $$p(\{F_i\} \mid C_O) = \prod_{i=1}^{N} p(F_i \mid C_O).$$

and $$p(\{F_i\} \mid C_{WO}) = \prod_{i=1}^{N} p(F_i \mid C_{WO}).$$

Using the Bayes result, we have $$p(C_O \mid \{F_i\}) = \frac{p(C_O)}{p(\{F_i\})} \prod_{i=1}^{N} p(F_i \mid C_O),$$

and $$p(C_{WO} \mid \{F_i\}) = \frac{p(C_{WO})}{p(\{F_i\})} \prod_{i=1}^{N} p(F_i \mid C_{WO}).$$

Dividing the first of these equations by the second results in $$\frac{p(C_O \mid \{F_i\})}{p(C_{WO} \mid \{F_i\})} = \frac{p(C_O)}{p(C_{WO})} \frac{\prod_{i=1}^{N} p(F_i \mid C_O)}{\prod_{i=1}^{N} p(F_i \mid C_{WO})},$$

which can be re-factored as $$\frac{p(C_O \mid \{F_i\})}{p(C_{WO} \mid \{F_i\})} = \frac{p(C_O)}{p(C_{WO})} \prod_{i=1}^{N} \frac{p(F_i \mid C_O)}{p(F_i \mid C_{WO})}.$$

Thus, the probability ratio on the left-hand side of this equation can be expressed as a series of likelihood ratios. Taking the logarithm of both sides yields $$\ln\left[\frac{p(C_O \mid \{F_i\})}{p(C_{WO} \mid \{F_i\})}\right] = \ln\left[\frac{p(C_O)}{p(C_{WO})}\right] + \left[\prod_{i=1}^{N} \frac{p(F_i \mid C_O)}{p(F_i \mid C_{WO})}\right].$$

The object is present if the right-hand side of this equation is greater than 0. Note that the values of $p(C_O)$ and $p(C_{WO})$ may be determined using a training data set or for simplicity may be assumed to be equal. Moreover, the values of $p(F_i|C_{WO})$ for each member of the set $\{F_i\}$ are determined in the calibration mode of operation, and the values of $p(F_i|C_O)$ for each member of the set $\{F_i\}$ may be determined during the position-tracking mode of operation using appropriate decision criteria. For example, a region of low strength and a region of high strength, such as those illustrated around the object 810 in embodiment 850, are unlikely and may be identified (with respect to the strengths determined in the calibration mode of operation) using thresholds. Also note that the value of the probability $p(C_O|\{F_i\})$ may be determined using $p(C_O|\{F_i\})+p(C_{WO}|\{F_i\})=1$.

In some embodiments, the preceding analysis is applied to a subset of the N devices. For example, at a given time an active region or a region of interest around a possible object, such as the object 810, may be determined. The contributions from the devices in this region may be summed to determine the likelihood ratios.

Figure 9:
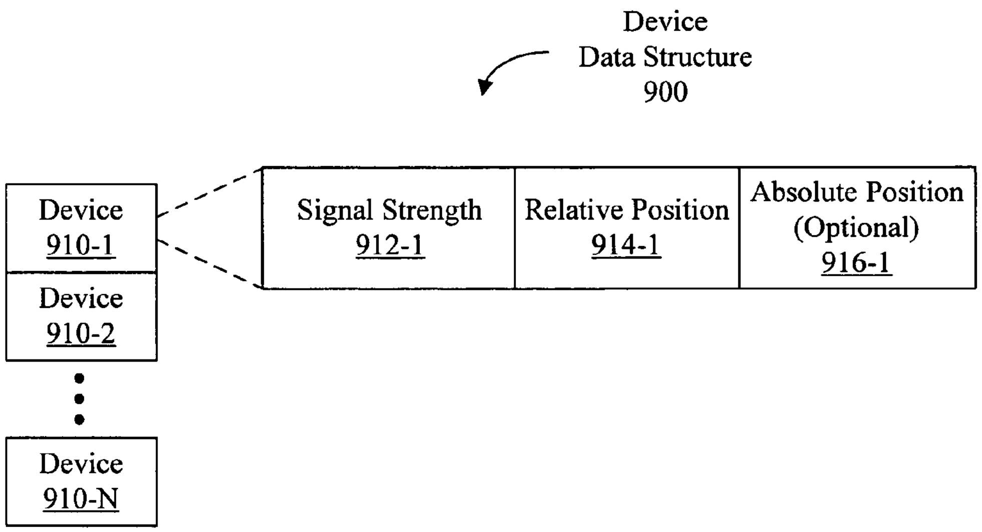
FIG. 9 is a block diagram illustrating an embodiment of a device data structure.

We now discuss data structures that may be used in the system, such as in the controller 400 (FIG. 4). FIG. 9 is a block diagram illustrating an embodiment of a device data structure 900, which includes multiple entries for devices 910. An entry for a given device, such as device 910-1, may include a signal strength 912-1 determined during the calibration mode of operation, a relative position 914-1, and/or an optional absolute position 916-1. This information may be used in conjunction with a supervised learning algorithm during the sensor-measurement mode of operation. In some embodiments, there may be fewer or additional elements, two or more elements may be combined into a single element, and positions of at least one element may be changed.

Figure 10:
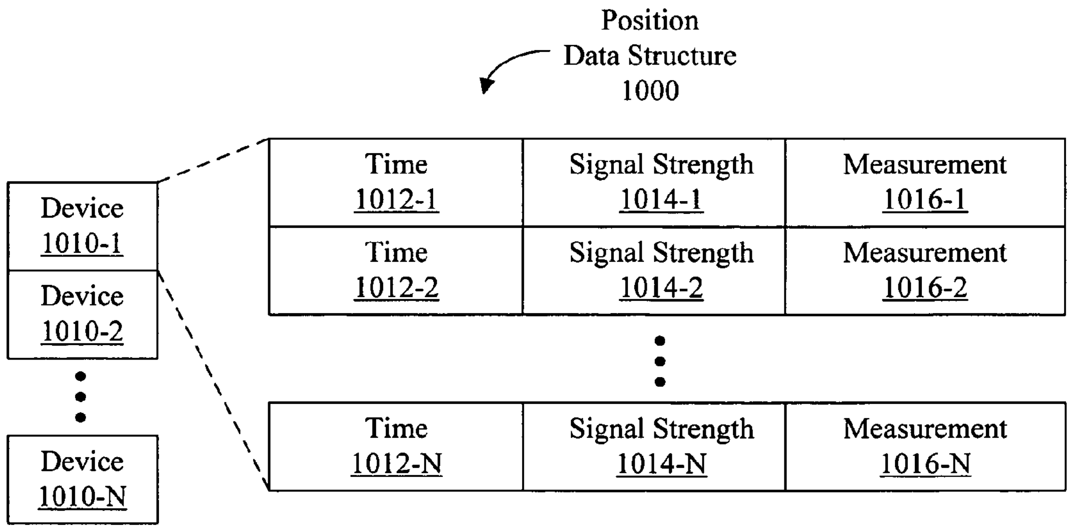
FIG. 10 is a block diagram illustrating an embodiment of a position data structure.

FIG. 10 is a block diagram illustrating an embodiment of a position data structure 1000, which includes multiple entries for devices 1010. An entry for a given device, such as device 1010-1, may include one or more times or time intervals 1012, corresponding signal strengths 1014 that are determined during the position-tracking mode of operation, and/or corresponding measurements 1016. The entries for the device 1010-1 may be a time sequence of results that were determined and/or measured as on object passed over the array.

The information in the position data structure 1000 may be used to determine the position, the velocity, and/or the acceleration of the object as a function of time. In some embodiments, there may be fewer or additional elements, two or more elements may be combined into a single element, and positions of at least one element may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A system, comprising:

a plurality of devices each including a sensor and each configured to communicate with other devices; and a controller configured to provide command information to the plurality of devices, wherein in the command information specifies:

a first mode of operation in which the plurality of devices transmit communication signals, and wherein a given device modifies a transmitting strength of a communication signal transmitted by the given device from an initial strength to a final strength in accordance with communication signals received by the given device from one or more other devices belonging to the plurality of devices; and a second mode of operation in which a position of an object is determined, wherein the plurality of devices transmit communication signals, and wherein the given device dynamically adjusts a transmitting strength of the communication signal transmitted by the given device in accordance with measurements performed by the sensor in the given device and communication signals received by the given device from one or more other devices belonging to the plurality of devices wherein during the second mode of operation, the position of the object is determined using a supervised learning technique selected from the group consisting of a support vector machine technique, a classification and regression tree technique, and a Bayesian classifier.

2. The system of claim 1, wherein the sensor includes an optical sensor.

3. The system of claim 1, wherein communication between the plurality of devices includes wireless communication.

4. The system of claim 1, wherein the one or more other devices are within a pre-determined distance from the given device.

5. The system of claim 1, wherein positions of the plurality of devices are unknown at the beginning of the first mode of operation.

6. The system of claim 1, wherein during the first mode of operation relative positions of the plurality of devices are determined in accordance with strengths of the communication signals.

7. The system of claim 6, further comprising a base station having a pre-determined location, wherein the base station provides a reference signal, and wherein absolute positions of the plurality of devices are determined in accordance with the reference signal and the relative positions.

8. The system of claim 6, wherein the relative positions are further determined in accordance with times of flight of pulses transmitted and received by the plurality of devices.

9. The system of claim 1, wherein the final strength is a difference between the initial strength and a weighted summation of strengths of the communication signals received from the one or more other devices.

10. The system of claim 1, wherein during the first mode of operation dimensions of a border of a region including the plurality of devices is determined in accordance with strengths of the communication signals.

11. The system of claim 1, wherein the command information provided by the controller further includes instructions specifying the initial strength.

12. The system of claim 1, wherein during the second mode of operation a position of an object is determined in accordance with sensor measurements performed by the plurality of devices and strengths of the communication signals in the first mode of operation and in the second mode of operation.

13. The system of claim 12, wherein the position of the object is further determined in accordance with one or more multi-path signals.

14. The system of claim 12, wherein dynamically adjusting the strength of communication signals during the second mode of operation facilitates lateral inhibition to increase a spatial resolution of the plurality of devices in determining the position of the object.

15. A method, comprising:

in a first mode of operation, transmitting communication signals from a plurality of devices, and modifying a transmitting strength of a communication signal transmitted from a given device from an initial strength to a final strength in accordance with communication signals received by the given device from one or more other devices belonging to the plurality of devices, wherein the final strength is a difference between the initial strength and a weighted summation of strengths of the communication signals received from the one or more other devices belonging to the plurality of devices; and in a second mode of operation in which a position of an object is determined, transmitting communication signals from a plurality of devices, and dynamically adjusting a transmitting strength of a communication signal transmitted from the given device in accordance with measurements performed by a sensor in the given device and communication signals received by the given device from one or more other devices belonging to the plurality of devices;

wherein during the second mode of operation, the position of the object is determined using a supervised learning technique selected from the group consisting of a support vector machine technique, a classification and regression tree technique, and a Bayesian classifier.

16. The method of claim 15, wherein during the first mode of operation the method further comprises determining strengths of the communication signals, and wherein during the second mode of operation the method further comprises dynamically adjusting strengths of the communication signals.

17. The method of claim 16, wherein during the first mode of operation the method further comprises determining relative positions of the plurality of devices in accordance with the strengths of the communication signals.

18. The method of claim 16, wherein during the second mode of operation the method further comprises determining a position of an object in accordance with sensor measurements performed by the plurality of devices and strengths of the communication signals in the first mode of operation and in the second mode of operation.

19. A computer-program product for use in conjunction with a computer system, the computer-program product comprising a computer-readable storage medium and a computer-program mechanism embedded therein, the computer-program mechanism including:

instructions for a first mode of operation, including instructions for transmitting communication signals from a plurality of devices, and instructions for modifying a transmitting strength of a communication signal transmitted from a given device from an initial strength to a final strength in accordance with communication signals received by the given device from one or more other devices belonging to the plurality of devices, wherein the final strength is a difference between the initial strength and a weighted summation of strengths of the communication signals received from the one or more other devices belonging to the plurality of devices; and instructions for a second mode of operation in which a position of an object is determined, including instructions for transmitting communication signals from a plurality of devices, and instructions for dynamically adjusting a transmitting strength of a communication signal transmitted from the given device in accordance with measurements performed by a sensor in the given device and communication signals received by the given device from one or more other devices belonging to the plurality of devices;

wherein during the second mode of operation, the position of the object is determined using a supervised learning technique selected from the group consisting of a support vector machine technique, a classification and regression tree technique, and a Bayesian classifier.

* * * * *